United States Patent
Iruvanti et al.

(10) Patent No.: US 8,455,998 B2
(45) Date of Patent: Jun. 4, 2013

(54) METHOD AND PACKAGE FOR CIRCUIT CHIP PACKAGING

(75) Inventors: Sushumna Iruvanti, Hopewell Junction, NY (US); Yves Martin, Yorktown Heights, NY (US); Theodore van Kessel, Yorktown Heights, NY (US); Xiaojin Wei, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/251,371

(22) Filed: Oct. 3, 2011

(65) Prior Publication Data

US 2012/0018873 A1    Jan. 26, 2012

Related U.S. Application Data

(62) Division of application No. 12/540,481, filed on Aug. 13, 2009, now Pat. No. 8,053,284.

(51) Int. Cl.
*H01L 23/34*    (2006.01)

(52) U.S. Cl.
USPC ............ 257/713; 257/704; 257/712; 257/717

(58) Field of Classification Search
USPC .................................. 257/704, 712, 713, 717
See application file for complete search history.

(56) References Cited

U.S. PATENT DOCUMENTS

| | | | |
|---|---|---|---|
| 3,896,544 | A | 7/1975 | Fosnough |
| 4,442,450 | A | 4/1984 | Lipschutz |
| 4,993,482 | A | 2/1991 | Dolbear |
| 5,289,337 | A | 2/1994 | Aghazadeh |
| 5,821,617 | A | 10/1998 | Autry |
| 6,091,603 | A | 7/2000 | Daves |
| 6,292,369 | B1 | 9/2001 | Daves |
| 6,681,482 | B1 | 1/2004 | Lischner |
| 6,882,041 | B1 | 4/2005 | Cheah |
| 6,896,045 | B2 | 5/2005 | Panek |
| 7,361,985 | B2 | 4/2008 | Yuan |
| 7,408,780 | B2 | 8/2008 | Karidis |
| 2007/0152323 | A1* | 7/2007 | Bish et al. .................... 257/706 |
| 2007/0284737 | A1* | 12/2007 | Too et al. ..................... 257/737 |
| 2008/0165502 | A1 | 7/2008 | Furman |
| 2009/0072387 | A1 | 3/2009 | Gaynes et al. |

* cited by examiner

*Primary Examiner* — Tan N Tran
(74) *Attorney, Agent, or Firm* — Cantor Colburn LLP; Vazken Alexanian

(57) ABSTRACT

A method and a package for circuit chip package having a bent structure. The circuit chip package includes: a substrate having a first coefficient of thermal expansion (CTE); a circuit chip, having a second CTE, mounted onto the substrate; a metal foil disposed on the circuit chip in thermal contact with the chip; a metal lid having (i) a third CTE that is different from the first CTE and (ii) a bottom edge region, where the metal lid is disposed on the metal foil in thermal contact with the metal foil; and an adhesive layer along the bottom edge of the metal lid, cured at a first temperature, bonding the lid to the substrate, producing an assembly which, at a second temperature, is transformed to a bent circuit chip package.

13 Claims, 4 Drawing Sheets

METHOD AND PACKAGE FOR CIRCUIT CHIP PACKAGING

CROSS-REFERENCE TO RELATED APPLICATIONS

This divisional application claims priority under 35 U.S.C. §120 from parent application U.S. patent application Ser. No. 12/540,481 filed Aug. 13, 2009, the entire contents of which are incorporated herein by reference.

BACKGROUND OF THE INVENTION

1. Field of the Invention

The present invention relates to the packaging of circuit chips and more particularly to providing a method of assembly and an apparatus for cooling circuit chip packages.

2. Description of Related Art

U.S. Pat. No. 6,292,369 describes a thermally conductive lid structure having a customized lid understructure and shim. This structure uses thermally conductive compliant or non-rigid materials in the primary heat dissipation path.

U.S. Patent Publication 2008-0165502, describes a patterned metal deformable thermal interface placed between a circuit chip and a heat dissipative structure to improve the quality of the heat dissipation path.

To reduce the stress placed on package elements resulting from temperature changes through various assembly steps and operation of the package, U.S. Pat. No. 5,821,617 teaches enhancing performance by providing a package which uses materials that are matched in CTE to each other and to a silicon circuit chip. This is because using different coefficients of thermal expansion (CTEs) of the materials of the package components increases stress. Accordingly, the use of materials having different coefficients of thermal expansion (CTEs) is discouraged by the industry, as taught by U.S. Pat. No. 5,821,617. Thus, there is a need for a package that provides good thermal coupling between a chip and a heat spreader or heat sink through excursions in the temperature of the package.

SUMMARY OF THE INVENTION

In an embodiment of the present invention, materials used for the components of a circuit chip package are selected to have different coefficients of thermal expansion. This is contrary to the generally recognized desire to reduce the stress placed on package elements by using materials which are matched in CTE. The selection of materials having different CTEs results in a package having a bend where bend increases stress on the thermal interfaces of the package, decreasing the thermal resistance of the thermal interfaces of the package.

In its broadest concept, the present invention provides an improved circuit chip package having a bent structure, wherein the improvement resides in an adhesive layer cured at a first temperature and disposed along a bottom edge of a metal lid bonding the lid to a substrate and producing an assembly which, at a second temperature, is transformed to a bent circuit chip package.

According to an aspect of the present invention, there is provided a method of assembling a bent circuit chip package. The method includes: providing a substrate having a first coefficient of thermal expansion (CTE); mounting onto the substrate a circuit chip having a second CTE; placing a metal foil on the circuit chip to establish thermal contact therewith; dispensing an adhesive onto a metal lid having a bottom edge region and a third CTE that is different from the first CTE, wherein the dispensing is along the bottom edge of the metal lid; placing the metal lid onto the metal foil to establish thermal contact therewith so that the bottom edge region having adhesive thereon is in contact with the substrate forming an assembly; compressing the assembly at a first temperature and at a pressure and length of time sufficient to cure the adhesive and bond the lid to the substrate; and changing temperature of the assembly to a second temperature causing the assembly to bend, thereby reducing thermal resistance of the thermal contacts and producing the bent circuit chip package.

According to another aspect of the present invention, there is provided a circuit chip package having a bent structure. The circuit chip package includes: a substrate having a first coefficient of thermal expansion (CTE); a circuit chip, having a second CTE, mounted onto the substrate; a metal foil disposed on the circuit chip in thermal contact therewith; a metal lid having (i) a third CTE that is different from the first CTE and (ii) a bottom edge region, wherein the metal lid is disposed on the metal foil in thermal contact therewith; and an adhesive layer along the bottom edge of the metal lid, cured at a first temperature, bonding the lid to the substrate, producing an assembly which, at a second temperature, is transformed to a bent circuit chip package.

According to yet another aspect of the present invention, there is provided an improved circuit chip package having a bent structure, a substrate with a first coefficient of thermal expansion (CTE), a circuit chip with a second CTE mounted onto the substrate, a metal foil disposed on the circuit chip in thermal contact therewith, and a metal lid with a third CTE that is different from the first CTE, with the lid having a bottom edge region and is disposed on the metal foil in thermal contact therewith.

The improvement includes:

an adhesive layer cured at a first temperature and disposed along the bottom edge of the metal lid bonding the lid to the substrate and producing an assembly which, at a second temperature, is transformed to a bent circuit chip package.

The circuit chip package of the present invention has the ability to dissipate heat generated by the chip or chips, especially by high power chips, because quality of the primary heat dissipation path away from the chip and out of the package module to the external surface of the package is greatly enhanced.

DETAILED DESCRIPTION OF THE PREFERRED EMBODIMENTS

Figure 1:
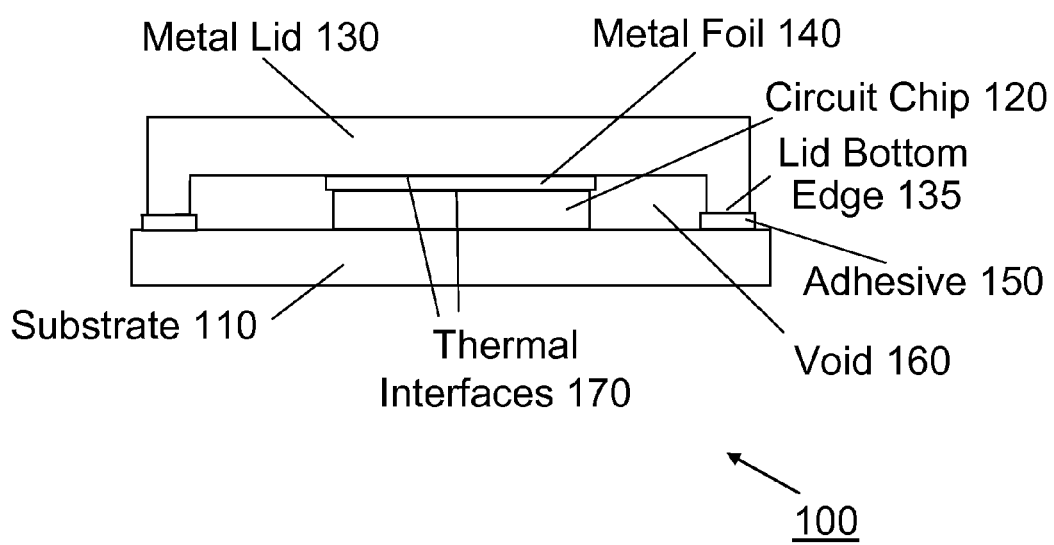
FIG. 1 is a diagram of an assembly of a circuit chip package, according to an embodiment of the present invention.

FIG. 1 is a schematic diagram 100 of an assembly according to an embodiment of the present invention. The drawing is not necessarily drawn to scale. The use of like numbers for elements in subsequent figures indicates like elements.

The first package element is substrate 110 upon which a circuit chip 120 has been mounted. The substrate can contain wiring elements, contact lands, and dielectric material. The bulk of the substrate is dielectric material. The material of the substrate including its interconnections or wiring will determine the expansion or contraction of the substrate resulting from temperature changes, e.g. the coefficient of thermal expansion of the substrate. The materials used can include organic materials, for example, epoxy or plastics, epoxy-glass or FR-4, or ceramics.

Mounted upon and electrically connected to the substrate is an integrated circuit chip (IC), 120. Such chips contain semiconductor logic or memory circuits or both. The bulk material of the chips can be silicon. The active surface of the circuit chip has wiring levels, typically aluminum or copper, semiconductor circuits, and lands for interconnection. Electrical connections of the chip circuitry to the substrate circuitry can be made by means of solder bonding. An example of this is the Controlled Collapse Chip Connection (C4) process developed by IBM. Other contacts or connections that can be used are conducting polymer composites.

In the assembly of the chip 120 and the substrate 110, conventional underfill, not shown, can be applied to fill the space between the circuit side of the chip 120 which faces the substrate and the top surface of the substrate. The underfill protects the electrical interconnections from mechanical stresses during thermal cycling. The underfill material can be an epoxy or other known underfill material.

In one embodiment of the present invention, a metal foil 140 serving as a thermal interface between the circuit chip 120, and the lid 130 is placed between the back or non-circuit side of the chip and the lid 130. The lid is a heat spreader and can be used separately as a heatsink in itself or with an additional heatsink added upon it.

The metal foil thermal interface 140 can be a patterned metal foil, a metal mesh or a perforated metal sheet. The metal of the thermal interface is a solid metal, i.e., solid in phase. The foil is made of a relatively soft metal that deforms readily under moderate pressure. In an embodiment of the present invention, the foil includes indium (In). Other metals that can be used include lead (Pb), gold (Au), silver (Ag), bismuth (Bi), antimony (Sb), tin (Sn), thallium (Tl) or gallium (Ga), or alloys containing these metals such as In—Sn, In—Ag, Pb—Sn. In another embodiment, the thermal interface 140 has a soft metal mesh. The thermal interface 140 can be patterned or textured; that is, the thermal interface exhibits a substantially uniform thickness and flatness but with local topography, high and low spots. In a further embodiment, the thermal interface has a thickness of approximately 150 microns.

The use of the patterned metal foil as a thermal interface, illustrated in FIG. 1, provides improved heat transfer from the heat generating circuit chip 120 to the heat spreader lid 130, thus allowing for better heat dissipation from the circuit chip 120. Specifically, when pressed between the chip and the lid heat spreader 106, the patterned metal foil deforms, allowing one thermal interface to conform to the back surface of the chip and another to the bottom surface of the lid, e.g., the surface of the lid facing the chip. This provides thermal contact between the chip and the metal foil thermal interface and also between the thermal metal foil and the lid. The thermal interfaces 170 are indicated in FIG. 1. Thus, heat generated by the chip is transferred to the base of the lid heat spreader via the patterned metal foil thermal interfaces. The base then spreads the heat to the remaining volume of the heat spreader lid. Better thermal coupling between the chip and the heat spreader lid, results in better heat dissipated by the assembly 100.

The back side of the circuit chip which is in contact with the metal foil can be coated with a thin layer of metal or two or more layers of metal. The coating can be accomplished by vacuum deposition. For instance, the layer of metal can be copper (Cu), nickel (Ni), gold (Au), or aluminum (Al). These metals can be used singly or have layers of chromium (Cr), chromium-copper (Cr—Cu), nickel-vanadium (Ni—V), or titanium (Ti) beneath them to assure adhesion to the silicon surface of the chip. These layers can be a few hundred nanometers thick.

The heat spreader lid 130 is placed in contact with the metal foil 140 and the substrate 110. The lid is in thermal contact with the metal foil at a thermal interface 170.

In one embodiment, the metal lid is preferably composed of copper (Cu), but can be nickel, or nickel-plated copper, or another elemental metal, or an alloy such as beryllium-copper (Be—Cu) or nickel-iron (Ni—Fe). For example, Alloy 42, a Ni—Fe alloy, can be used for the lid material. The lid surface which faces the metal foil can have another material coated on its surface by vacuum deposition or plating to assure better contact to the metal foil. Surface metals that can be used include gold (Au), nickel, tin, or copper. These surface coatings can be a few hundred nanometers thick.

The bottom edge of the lid 135 is bonded to the substrate by means of an adhesive 150 as shown in FIG. 1. The adhesive 150 is dispensed along the bottom edge of the lid 135. In an embodiment of the present invention, an adhesive that is used to bond the edge of the lid to the substrate is Dow Corning Sylgard® 577 silicone adhesive. This adhesive can be cured at temperatures between 100° C. and 130° C. This temperature approaches but does not exceed the melting point of indium, 156° C. The curing time for the adhesive can be between 1 and 100 minutes. The time depends on the temperature and type of sealant used.

When the package is assembled, the metal foil is compressed between the circuit chip and the lid. The pressure applied during assembly is typically between 10 and 100 lb/in$^2$, approximately 70 to 700 kPa. Raising the temperature between 100° C. to 130° C. during the early phase of the compression accelerates the compression of the metal foil to conform to the shape of the chip and lid heat-sink. This provides some intermetallic bonding between the metal foil and the metals of the lid and/or chip whose surfaces can be Cu, Ni, or Au. The temperature is kept below the melting temperature of the foil, 156° C., for example, for an indium foil. The temperature does not need precise monitoring.

The assembly can be done in situ, with the substrate, chip and lid positioned in their final location on the computer mother board. In one embodiment, the package substrate is placed in a socket with spring-like electrical contacts. This arrangement is often called a Land-Grid Array (LGA). Automatic assembly provides for robotic placement of the components, starting with the substrate and chip in the socket. This is followed by placement of the metal foil over the chip, dispensing of the adhesive on the seal area in viscous liquid form over the processor substrate or the lid, placement of the lid, and placement of a heat-sink with compression springs over the lid. The mother board with the assembled package is then heated to a mild temperature 100° C. to 130° C. for in-situ curing of the metal foil and of the adhesive, while the package is held in compression. Alternatively, the processor and lid can be assembled as a module, to be inserted in a computer mother board at a later stage. The assembly can leave a void area 160 under the lid. This air-filled area can be filled later with a thermal conducting material.

The advantages of this assembly method and of the resulting package are multiple. They include reduced complexity compared to the traditional soldered lid process. No flux, no critical chip metallization, and no need of tight control of the solder melting process are required. Because no melting of the metal foil occurs, the bond-line is kept very precise, and defined by the original foil thickness.

Figure 2:
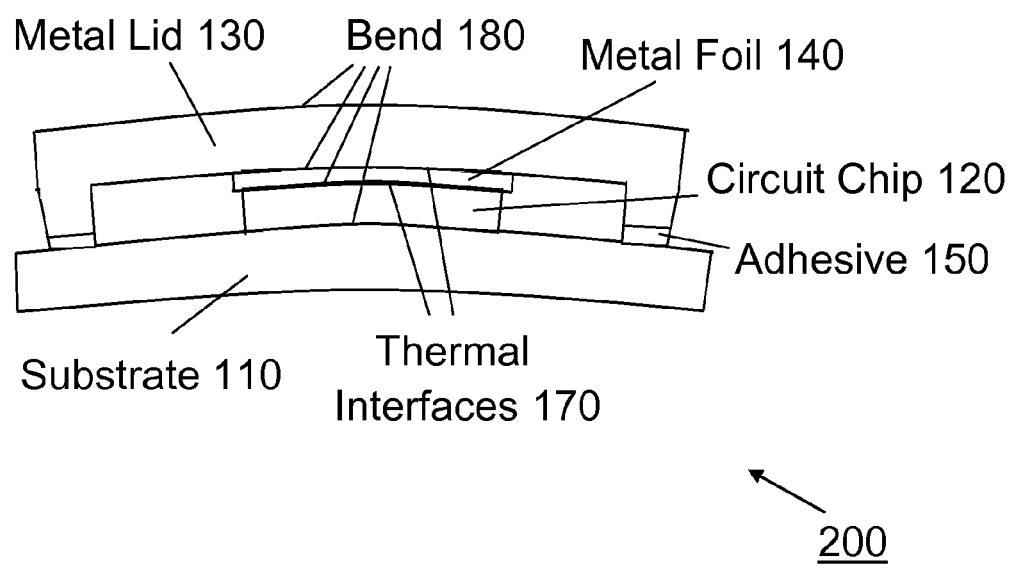
FIG. 2 is a diagram illustrating the circuit chip package of the present invention.

FIG. 2 is a diagram further illustrating the circuit chip package of the present invention as assembled and in operation. In FIG. 1, at the time of the assembly of the package, when the adhesive is cured typically in the range of 100° C. to 130° C., the horizontal surfaces of the package are relatively parallel to one another.

However, upon changing the temperature from the curing temperature, 100° C. to 130° C., to a different temperature, for example, to room temperature, approximately 20° C., or to normal operating temperature of the package, approximately 60° C. to 70° C., the package assembly, 200, can be made to bend. All of the components have a bend as shown, but while the whole package takes on a bend, the bend 180 at the thermal interfaces 170 is particularly important. The bend takes a convex shape when viewed from above the lid, as shown in FIG. 2. The bend is caused by the change in temperature. This bend is produced by the selected materials of the package elements or components based upon the CTEs of those components, and the relative temperature for assembly vs. storage or operation.

For example, the materials used for the substrate 110 include organic materials, epoxy or plastics having CTEs equal to 50 ppm/° C. or higher, epoxy-glass or FR-4 having CTEs equal to 15 to 20 ppm/° C., or ceramics having CTEs equal to 0 to 10 ppm/° C.

The integrated circuit chip 120 is generally composed of silicon. Silicon has a relatively low CTE, equal to 3 ppm/° C.

The lid can be made of a variety of metals including: aluminum, CTE equal to 23 ppm/° C. copper, CTE equal to 17 ppm/° C., nickel, CTE equal to 14 ppm/° C., Alloy 42, CTE equal to 5 ppm/° C.

Thus if the assembly components including the lid, the chip, and the substrate are selected such that the CTE of the substrate is greater than that of the chip and that of the lid, when the package is cooled from a relatively higher package assembly and curing temperature of 130° C. to a relatively lower normal operating temperature of 70° C. or room temperature of around 20° C., the substrate will contract more than the other components, forcing the package to bend to take the convex configuration shown in FIG. 2.

In an embodiment of the present invention the lid can be copper, CTE equal to 17 ppm/° C., the circuit chip, silicon, CTE equal to 3 ppm/° C., and the substrate can be epoxy-glass selected to have a CTE equal to 20 ppm/° C. Alternatively, the substrate can be selected to be a plastic or organic material have a CTE equal to or greater than 50 ppm/° C. The bend of the package 180, particularly at the thermal interfaces 170, applies added stress to the metal foil thermal interfaces between the metal foil and the chip and between the metal foil and the lid. This reduces the thermal resistance of the thermal contacts between the back of the chip and the metal foil and the metal foil and the lid. This is beneficial for the proper working and integrity of the thermal interfaces.

Thus, using this package design, pressure applied to the metal foil interface, under normal operation, is always positive. This is a key step in making the metal foil interface package which uses indium or other soft metal foil an effective heat dissipation device. The metal foil must be kept under positive pressure since its deformation is essentially plastic and not elastic.

Alternatively, a concave package shape can be obtained if desired by inverting the selection of CTEs for the materials of the package components or the selection of assembly and operating temperatures. This concave bend can also be used to add stress to the thermal interface to enhance the quality of the thermal contacts.

The package method and apparatus need not be limited to cases in which the package is assemble and cured at a first temperature and then operated at a second lower temperature. For instance, the package and adhesive can be assembled and cured at a relatively lower temperature, for example, room temperature at 20° C. and then it can be operated at 70° C. In that case, the selection of materials having different CTEs can be reversed to achieve the convex warping of the package.

For example, if it is desired to use a copper lid, CTE equal to 17 ppm/° C., then the substrate can be chosen to be a low CTE material, for example, a ceramic having a CTE equal to 3 ppm/° C. Then, at assembly and curing at 20° C., the package will resemble the illustration of FIG. 1. When the package takes on the normal operating temperature of 70° C., as a result of the greater expansion of the lid compared to that of the chip and substrate, the package will take on the convex shape shown in FIG. 2.

In general, the semiconductor circuit chip of the package will be silicon. There will not be a choice in the selection of the CTE of the chip material if the chip is silicon. However, other materials for the chip, e.g., sapphire or diamond, can be used. The selection of materials of proper CTE to achieve the desired convex shape will primarily depend on the selection of the CTEs for the materials making up the lid and the cap.

Packages have been designed and assembled according to the method and using the materials described above. Tests have shown the thermal resistances of the indium metal interface to be as low as 5 mm$^2$ deg C./Watt. This can be compared to conventional packages using thermal paste as the conductive heat transfer element where thermal resistances have been found to be 13 to 15 mm$^2$ deg C./Watt.

Figure 3:
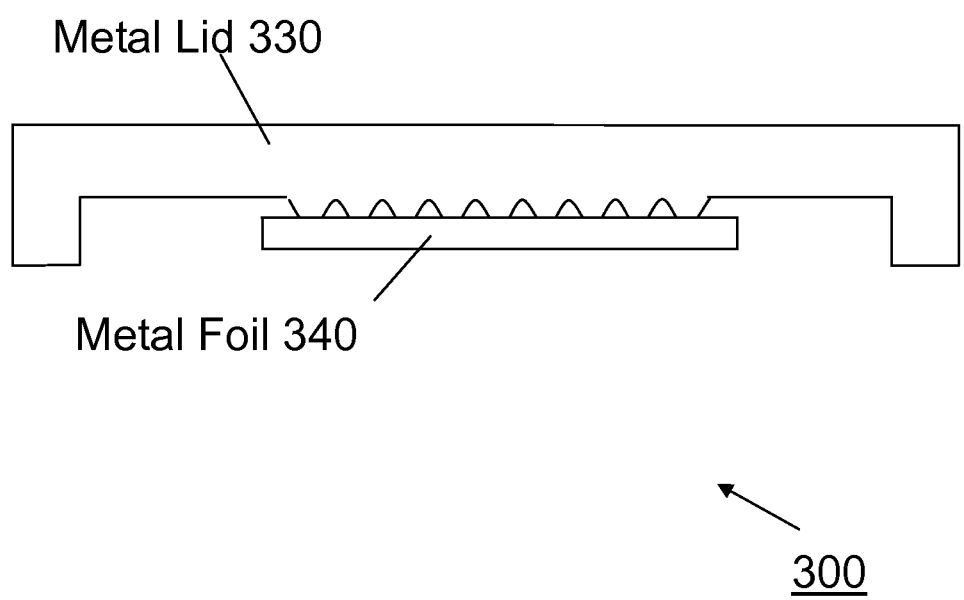
FIG. 3 is a diagram illustrating an alternative embodiment.

FIG. 3 is a diagram illustrating an alternative embodiment of the present invention. The alternative assembly uses a patterned lid and a patterned or relatively un-patterned soft metal foil. The soft metal foil is partially bonded to the lid, for example by pressing the foil into the lid pattern, with or without the addition of heat or surface treatment of the patterned lid. The surface treatment can be in the form of pre-tinning, or application of a thin layer of adhesive onto the lid. Compression and assembly of this lid structure onto the processor chip as described above results in a lidded module with a highly conducting metal thermal interface.

Figure 4:
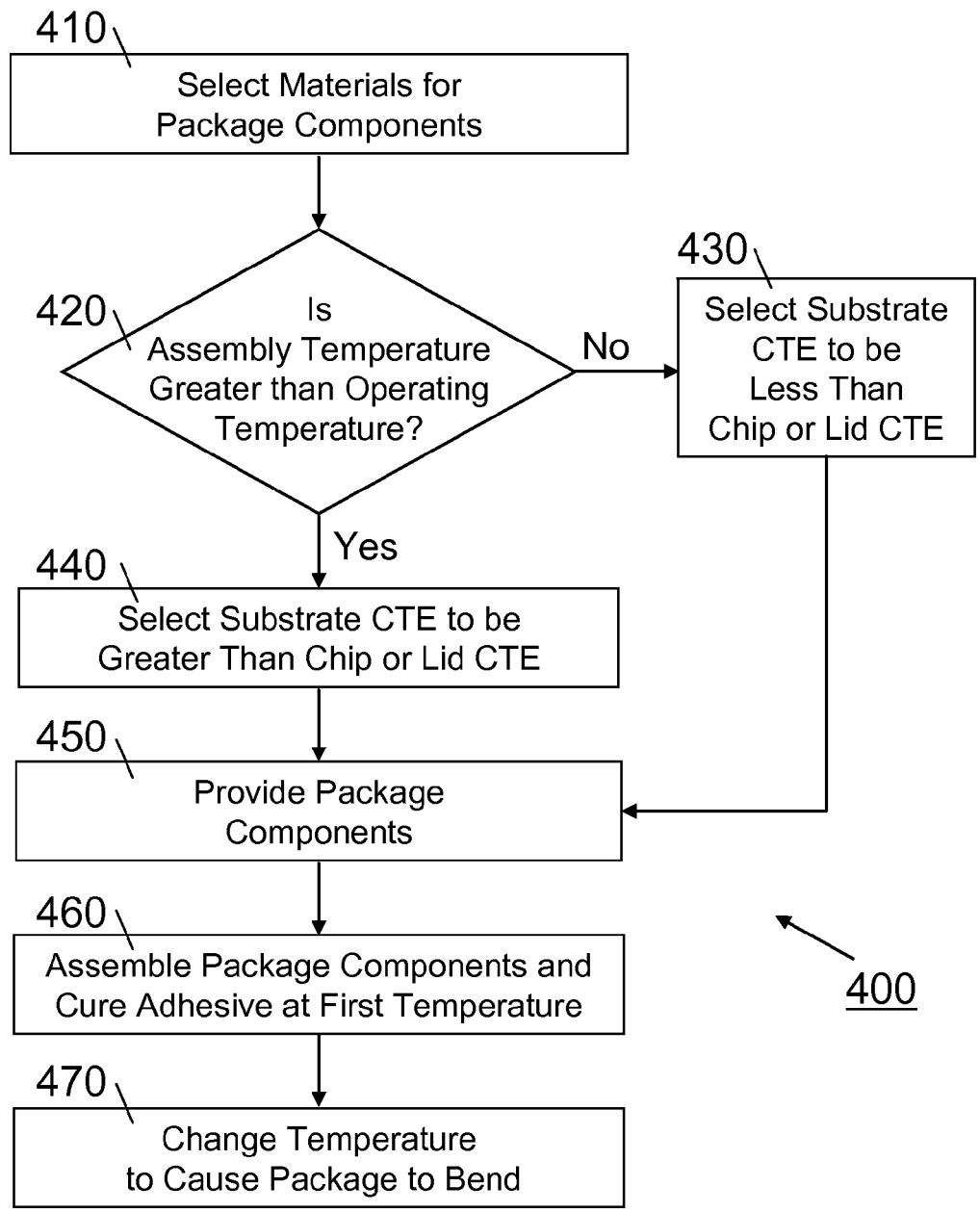
FIG. 4 is a flow chart illustrating the method of assembly of the circuit chip package according to an embodiment of the present invention.

FIG. 4 is a flow chart illustrating the method of an embodiment of the present invention. The flow chart 400 begins with the selection of materials for the package components 410. The substrate, the chip and the lid the lid materials are selected according to their coefficients of thermal expansion (CTE).

The materials' CTEs are chosen in step 420 so as to cause the package to bend in a convex shape, as viewed from above the lid, when the package is operated at its operating temperature. The assembly temperature is taken to be the curing temperature of the adhesive.

In step 420, if the assembly temperature is greater than the operating temperature, then the process moves to step 440. If the assembly temperature is less than the operating temperature, then the process moves to step 430.

In step 430, the selection is made so that the CTE of the substrate material is less than the CTE of the chip or of the lid.

In step 440, the selection is made so that the CTE of the substrate material is greater than the CTE of the chip or of the lid. Examples of suitable materials have been given in the descriptions of FIGS. 1 and 2, above.

Alternatively, it can be that the materials for the substrate, chip and lid components have been pre-selected. In this instance, an appropriate assembly and adhesive curing temperature can be selected. For example, the process is to select an adhesive with a curing temperature that is greater than the operating temperature when the CTE of the substrate is greater than the CTE of the chip or of the CTE of the lid. Also, the process is to select an adhesive with a curing temperature that is less than the operating temperature when the CTE of the substrate is less than the CTE of the chip or of the CTE of the lid.

In step 450, the package components having selected or predetermined CTEs are provided. The adhesive to be used in the next step will have a predetermined or selected curing temperature.

In step 460, the components are assembled. The assembly process includes: providing the adhesive to bond the lid to the substrate; placing the metal foil on the circuit chip as described in FIGS. 1 and 2; dispensing the adhesive on the bottom edge of the lid; placing the lid over the metal foil on the circuit chip and the substrate; holding the assembly in compression at a first temperature, e.g., the adhesive curing temperature, for a time, and at a pressure, as discussed in the explanation for FIG. 1. This cures the adhesive and bonds the lid to the substrate.

In step 470, the package is caused to assume a desired convex shape, as shown in FIG. 2, when the temperature of the package is changed to a different or second temperature, e.g., at the storage or the operating temperature. The bending of the package in the convex shape applies added stress to the metal foil thermal interface. Thus, the materials for the components of the package are selected to have different coefficients of thermal expansion, contrary to the prevailing patent teachings. These different CTEs for the components, when taken in conjunction with the different temperatures of assembly and operation, produce a circuit chip package exhibiting superior thermal performance.

While the present invention has been described with reference to what are presently considered to be the preferred embodiments, it is to be understood that the present invention is not limited to the disclosed embodiments. On the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A circuit chip package having a bent structure, comprising:
    a substrate having a first coefficient of thermal expansion (CTE);
    a circuit chip, having a second CTE, mounted onto the substrate;
    a metal foil disposed on the circuit chip in thermal contact therewith;
    a metal lid having (i) a third CTE that is different from the first CTE and (ii) a bottom edge region, wherein the metal lid is disposed on the metal foil in thermal contact therewith; and
    an adhesive layer along the bottom edge of the metal lid, cured at a first temperature, bonding the lid to the substrate, producing an assembly which, at a second temperature, is transformed to a bent circuit chip package,
    wherein the metal lid, the metal foil, the circuit chip, the substrate and the adhesive layer are uniformly bent.

2. The circuit chip package according to claim 1, wherein the bent assembly has a bend which reduces thermal resistance of the circuit chip package.

3. The circuit chip package according to claim 1, wherein the first CTE is greater than the third CTE when the first temperature is greater than the second temperature.

4. The circuit chip package according to claim 1, wherein the first CTE is less than the third CTE when the first temperature is less than the second temperature.

5. The circuit chip package according to claim 1, wherein the first temperature is the adhesive curing temperature.

6. The circuit chip package according to claim 1, wherein the second temperature is room temperature or the operating temperature of the package.

7. The circuit chip package according to claim 1, wherein a lid surface that is in thermal contact with the metal foil is patterned.

8. The circuit chip package according to claim 1, wherein the metal foil is patterned.

9. The circuit chip package according to claim 1, wherein the metal foil has a metal selected from the group consisting of: indium, lead (Pb), gold, silver, bismuth, antimony, tin, thallium, gallium, and an alloy thereof.

10. The circuit chip package according to claim 9, wherein the alloy is selected from the group consisting of: indium-tin, indium-silver, and lead-tin (Pb—Sn).

11. The circuit chip package of claim 1, wherein a circuit chip surface that is in thermal contact with the metal foil has a coating of a metal selected from the group consisting of: gold, copper, nickel, chromium, titanium, and aluminum.

12. The circuit chip package of claim 1, wherein a lid surface that is in contact with the metal foil has a coating of a metal selected from the group consisting of: gold, nickel, tin, chromium, titanium, and copper.

13. An improved circuit chip package having a bent structure, a substrate with a first coefficient of thermal expansion (CTE), a circuit chip with a second CTE mounted onto the substrate, a metal foil disposed on the circuit chip in thermal contact therewith, and a metal lid with a third CTE that is different from the first CTE, with the lid having a bottom edge region and is disposed on the metal foil in thermal contact therewith, wherein the improvement comprises:
    an adhesive layer cured at a first temperature and disposed along the bottom edge of the metal lid bonding the lid to the substrate and producing an assembly which, at a second temperature, is transformed to a bent circuit chip package, wherein the metal lid, the metal foil, the circuit chip, the substrate and the adhesive layer are uniformly bent.

* * * * *